(12) United States Patent
Riley

(10) Patent No.: US 7,698,608 B2
(45) Date of Patent: *Apr. 13, 2010

(54) USING A SINGLE BANK OF EFUSES TO SUCCESSIVELY STORE TESTING DATA FROM MULTIPLE STAGES OF TESTING

(75) Inventor: Mack Wayne Riley, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 163 days.

This patent is subject to a terminal disclaimer.

(21) Appl. No.: 11/956,458

(22) Filed: Dec. 14, 2007

(65) Prior Publication Data

US 2008/0104469 A1    May 1, 2008

Related U.S. Application Data

(63) Continuation of application No. 11/146,988, filed on Jun. 6, 2005, now Pat. No. 7,373,573.

(51) Int. Cl.
    *G11C 29/00* (2006.01)
(52) U.S. Cl. ............... 714/711; 714/6; 714/30; 714/718; 714/726; 714/733
(58) Field of Classification Search ............ 714/6, 714/30, 711, 718, 726, 733
    See application file for complete search history.

(56) References Cited

U.S. PATENT DOCUMENTS

| 6,141,779 | A  | 10/2000 | Hill et al. |
| 6,434,066 | B1 | 8/2002  | Waller et al. |
| 6,639,848 | B2 | 10/2003 | Maejima |
| 6,651,202 | B1* | 11/2003 | Phan ................... 714/733 |
| 6,747,481 | B1 | 6/2004 | Pitts |
| 6,871,297 | B2* | 3/2005 | Puri et al. ............. 714/30 |
| 7,043,672 | B2 | 5/2006 | Merritt |
| 7,053,470 | B1 | 5/2006 | Sellers et al. |
| 7,076,699 | B1* | 7/2006 | Puri et al. ............ 714/710 |
| 7,093,156 | B1* | 8/2006 | Shubat et al. ........... 714/5 |

(Continued)

FOREIGN PATENT DOCUMENTS

CN    1398407 A    2/2003

(Continued)

*Primary Examiner*—Esaw T Abraham
(74) *Attorney, Agent, or Firm*—Francis Lammes; Stephen J. Walder, Jr.; Matthew B. Talpis

(57) ABSTRACT

A mechanism is provided for using a single bank of electric fuses (eFuses) to successively store test data derived from multiple stages of testing are provided. To encode and store array redundancy data from each subsequent test in the same bank of eFuses, a latch on a scan chain is used that holds the programming information for each eFuse. This latch allows for programming only a portion of eFuses during each stage of testing. Moreover, the data programmed in the eFuses can be sensed and read as part of a scan chain. Thus, it can be easily determined what portions of the bank of eFuses have already been programmed by a previous stage of testing and where to start programming the next set of data into the bank of eFuses. As a result, the single bank of eFuses stores multiple sets of data from a plurality of test stages.

12 Claims, 4 Drawing Sheets

U.S. PATENT DOCUMENTS

| | | |
|---|---|---|
| 7,308,598 B2 | 12/2007 | Beattie et al. |
| 7,373,573 B2 * | 5/2008 | Riley .......................... 714/733 |
| 2001/0016893 A1 | 8/2001 | Merritt |
| 2004/0153900 A1 | 8/2004 | Adams et al. |

FOREIGN PATENT DOCUMENTS

| | | |
|---|---|---|
| KR | 1995-0004623 | 5/1995 |
| KR | 2002-0030537 | 4/2002 |

\* cited by examiner

200

| BIT DEFINITION | | | | DESCRIPTION | COMMAND TYPE |
|---|---|---|---|---|---|
| 0 | 1 | 2 | 3 | | |
| 0 | 0 | 0 | 0 | END OF E-FUSE DATA | CONTROL |
| | | | 1 | ADJUST BY 1. SHIFT ONE ZERO INTO THE RING | ZERO |
| 0 | 0 | 1 | 0 | ADJUST BY 2. SHIFT TWO ZEROS INTO THE RING | ZERO |
| | | | 1 | NEXT 7 BITS SHIFTED INTO THE RING ARE ZERO | ZERO |
| 0 | 1 | 0 | 0 | NEXT 8 BITS SHIFTED INTO THE RING ARE ZERO | ZERO |
| | | | 1 | NEXT 9 BITS SHIFTED INTO THE RING ARE ZERO | ZERO |
| 0 | 1 | 1 | 0 | NEXT 7 BITS ARE ACTUAL DATA TO BE SHIFTED INTO THE RING | ACTUAL |
| | | | 1 | NEXT 8 BITS ARE ACTUAL DATA TO BE SHIFTED INTO THE RING | ACTUAL |
| 1 | 0 | 0 | 0 | NEXT 9 BITS ARE ACTUAL DATA TO BE SHIFTED INTO THE RING | ACTUAL |
| | | | 1 | NEXT 14 BITS ARE ACTUAL DATA TO BE SHIFTED INTO THE RING | ACTUAL |
| 1 | 0 | 1 | 0 | NEXT 16 BITS ARE ACTUAL DATA TO BE SHIFTED INTO THE RING | ACTUAL |
| | | | 1 | NEXT 18 BITS ARE ACTUAL DATA TO BE SHIFTED INTO THE RING | ACTUAL |
| 1 | 1 | 0 | 0 | SKIP SHORT. SKIP BY THE NUMBER OF BITS SPECIFIED IN THE NEXT 4-BIT FIELDS. FOR SKIP, SIMPLY SHIFT THE RING. DO NOT INSERT NEW DATA | SKIP |
| | | | 1 | SKIP LONG. SKIP BY THE NUMBER OF BITS SPECIFIED IN THE NEXT 8-BIT FIELDS. FOR SKIP, SIMPLY SHIFT THE RING. DO NOT INSERT NEW DATA | SKIP |
| 1 | 1 | 1 | 0 | RESUME SHIFTING THE REDUNDANCY RING STARTING WITH THE NEXT 4-BIT CODE | CONTROL |
| | | | 1 | CONTINUE READING E-FUSE, BUT DO NOT SHIFT REDUNDANCY RING | CONTROL |

*FIG. 2*

USING A SINGLE BANK OF EFUSES TO SUCCESSIVELY STORE TESTING DATA FROM MULTIPLE STAGES OF TESTING

This application is a continuation of application Ser. No. 11/146,988, filed Jun. 6, 2005, issued as U.S. Pat. No. 7,373,573 B2 on May 13, 2008.

BACKGROUND OF THE INVENTION

1. Technical Field

The present invention relates generally to an improved data processing system and method. More specifically, the present invention is directed to an apparatus and method for using a single bank of electrical fuses (eFuses) to successively store testing data from multiple stages of testing.

2. Description of Related Art

Traditionally, the manufacturers of complex integrated circuits with arrays of components use multiple stages of testing to test the operation of the various components. For example, a manufacturer may first test the components of the integrated circuit at normal temperature and voltage in wafer form. The manufacturer may then run additional tests of the good components, i.e. those that pass the initial test, under stress. The manufacturer may then test the integrated circuit again when it is packaged. Other tests may also be included in the test regime to check the operation of the components of the integrated circuit under various conditions.

For example, large integrated circuits and processors typically include large arrays of memory cells as part of their design. To ensure a reasonable yield, these arrays have built-in spare cells, i.e. redundant cells, that may be substituted for any less than perfect cell. When these large arrays are tested, it is determined which cells need to be mapped to the spare or redundant cells of the array of memory cells. This information is transformed into data that is referred to as array redundancy data.

The data that is required for each cell substitution is called a repair and the correction performed based on this data is referred to as a repair action. These repair actions are necessary to skip over the non-functional cells in the array, and map to the redundant cells. These repair actions are loaded serially, one after the other. Once an array tester determines the required array redundancy data or the required repair actions, this data must be reloaded at power-on of the integrated circuit device or processor.

Each of the tests may produce array redundancy data which may be used to correct the arrays of components upon power-on. This array redundancy data, once verified, is typically stored in an area of the integrated circuit device or processor that can be programmed at test time, such as a bank of laser fuses, electrical fuses (eFuses) or other type of storage device. On a large integrated circuit device or processor, there is a large amount of array redundancy data that can take up large amounts of eFuses. Large numbers of eFuses occupy a large area of the device.

In addition, for each stage of testing, a specific dedicated separate bank of eFuses, located on the integrated circuit, is required to store the array redundancy data generated by that stage of testing. Each of these separate banks of eFuses thus, requires its own separate device area on the integrated circuit and its own control logic. Moreover, if there are any eFuses left over from one stage of testing, they cannot be used in any subsequent stage of testing.

Thus, the known mechanisms for storing and using array redundancy data from multiple stages of testing of an integrated circuit device result in excess area of the integrated circuit device or processor being dedicated to banks of eFuses and result in wasted space when eFuses are not able to be utilized from one stage of testing to the next. This is undesirable in that the extra area and logic impact the function and cost of the overall integrated circuit device or processor. Moreover, if the device is larger, then more power is needed to operate it.

In view of the above, it would be beneficial to have an apparatus and method for reducing the amount of area on an integrated circuit device that is needed for providing banks of eFuses. Moreover, it would be beneficial to have an apparatus and method that reduces the amount of wasted space generated by the inability to use eFuses from one test to the next in a series of multiple test stages.

SUMMARY OF THE INVENTION

The present invention provides an apparatus and method for using a single bank of electric fuses (eFuses), laser fuses, or other type of storage device, to successively store test data derived from multiple stages of testing. In one exemplary embodiment of the present invention, the apparatus and method are used to store compressed array redundancy data derived from multiple stages of testing in a single bank of eFuses.

With the apparatus and method of the present invention, to encode and store array redundancy data from each subsequent test in the same bank of eFuses, latches associated with eFuses of a scan chain, on a one-to-one basis, are used to hold the programming information for each eFuse. These latches provide a mechanism for identifying which eFuses have already been programmed so that only a portion of eFuses within the bank need be programmed during each stage of testing. Large numbers of unprogrammed eFuses may be easily identified by simply loading these latches with an unprogrammed value, e.g., a logic "0."

The data programmed in the eFuses can be sensed and read as part of a scan chain. Thus, it can be easily determined what portions of the bank of eFuses have already been programmed by a previous stage of testing and where to start programming the next set of data into the bank of eFuses. As a result, the single bank of eFuses stores multiple sets of data from a plurality of test stages.

In addition, a data compression encoding technique is provided by the present invention to concisely encode a full redundancy ring. In particular, a skip command is provided for skipping to an appropriate portion of the bank of eFuses for writing and/or reading data to/from the bank of eFuses. The skip command does two things: (1) it allows the redundancy data to be concisely encoded via a long or short skip command followed by either 8 or 4 bits that specify how many bits to skip (up to 255 or up to 15 bits); and (2) it allows multiple passes when loading the actual redundancy ring because each pass can easily skip large groups of data, leaving the previous data in place for those components.

Thus, each test stage, the redundancy data for the whole redundancy ring is encoded in the single bank of eFuses. If redundancy data has been encoded and stored from three different tests, then at power-on time of the integrated circuit device, the array redundancy ring is loaded in three passes. The subsequent passes will "skip" any previously written data, by virtue of the skip command, so that only additional failures/corrections are added with each pass.

In one exemplary embodiment of the present invention, an apparatus, on an integrated circuit device, for storing array redundancy data on the integrated circuit device is provided. The apparatus includes a single bank of storage devices dedicated to storing array redundancy data for a plurality of stages of testing of the integrated circuit device and control logic for controlling decoding of encoded array redundancy data stored in the single bank of storage devices. The encoded array redundancy data stored in the single bank of storage devices is array redundancy data generated by a plurality of stages of testing of one or more arrays of devices provided on the integrated circuit device.

The single bank of storage devices may be a bank of electric fuses (eFuses). The single bank of storage devices may be arranged as a scan chain of storage devices. Each storage device may have an associated latch that stores a value indicative of whether the storage device has been previously programmed or is unprogrammed.

The encoded array redundancy data may include bit codes that identify a compression methodology of the encoded array redundancy data. The bit codes may include a skip bit code for skipping a portion of the bank of storage devices to thereby access encoded array redundancy data for a stage of testing other than a first stage of testing.

Each array of devices in the one or more arrays of devices may include at least one redundant device for substituting for another device in the array. In addition, the array redundancy data may identify failed devices in the one or more arrays of devices for which substitution with a redundant device is needed. The control logic may decode the encoded array redundancy data and may load the decoded array redundancy data into the one or more arrays of devices in order to perform one or more repair actions on the one or more arrays of devices.

The apparatus may further include a testing device and a test interface coupled to the one or more arrays of devices and the testing device. The testing device may perform, via the test interface, a plurality of stages of testing on the one or more arrays of devices to thereby generate a plurality of sets of array redundancy data. The testing device may output, via the test interface, the plurality of sets of array redundancy data to an external computing device for analysis.

The apparatus may further include a storage device interface coupled to the bank of storage devices and the external computing device. The control logic in the external computing device may encode the array redundancy data and write the encoded array redundancy data to the bank of storage devices via the storage device interface. In addition, the control logic in the external computing device may read values stored in latches associated with storage devices in the bank of storage devices to identify a first storage device that is unprogrammed and write the encoded array redundancy data from a stage of testing to the bank of storage devices starting at the first storage device that is unprogrammed.

In another embodiment of the present invention, a method, in a data processing system, for storing encoded array redundancy data in a single bank of storage devices on an integrated circuit device is provided. The method includes receiving encoded array redundancy data from an external computing device, wherein the encoded array redundancy data is for a stage of testing in a plurality of stages of testing of one or more arrays of devices on the integrated circuit device. The method further includes identifying a first unprogrammed storage device in the single bank of storage devices and storing the encoded array redundancy data in the single bank of storage devices starting at the first unprogrammed storage device. The single bank of storage devices may store encoded array redundancy data for each stage of the plurality of stages of testing.

In another embodiment of the present invention, an integrated circuit device is provided that includes a bank of electric fuses, a plurality of memory arrays, a power on control and array redundancy decompression unit, and an array built-in self test unit. Each memory array may include a plurality of memory cells that include at least one redundant memory cell. The power on control and array redundancy decompression unit may be coupled to the bank of eFuses and a at least one memory array in the plurality of memory arrays. The array built-in self test (ABIST) unit may be coupled to the plurality of memory arrays.

The ABIST unit may perform a plurality of stages of testing on the plurality of memory arrays to generate array redundancy data. The array redundancy data for all of the stages of testing may be encoded and stored in the bank of eFuses. At power on of the integrated circuit device, the power on control and array redundancy decompression unit may decode the encoded array redundancy data in the bank of eFuses and load the decoded array redundancy data into the plurality of memory arrays to perform one or more repair actions.

In addition, the integrated circuit device may include an array test interface coupled to the at least one memory array in the plurality of memory arrays and an eFuse test interface coupled to the bank of eFuses. The array test interface may output array redundancy data from the plurality of memory arrays to an external computing device for analysis. The eFuse test interface may receive encoded array redundancy data from the external computing device for storage in the bank of eFuses.

These and other features and advantages of the present invention will be described in, or will become apparent to those of ordinary skill in the art in view of, the following detailed description of the preferred embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 2 is an exemplary diagram illustrating a table of commands that may be used to implement a compression/decompression algorithm in accordance with one exemplary embodiment of the present invention;

DETAILED DESCRIPTION OF THE PREFERRED EMBODIMENT

As mentioned above, the present invention is directed to an apparatus and method for using a single bank of storage devices, such as electric fuses (eFuses) or laser fuses, to successively store test data derived from multiple stages of testing. The present invention may be used with any apparatus in which an array of components is provided with one or more redundant components being provided in the array for substitution in the case of a failure of a component in the array. Such apparatus may take the form of an integrated circuit device, a microprocessor, or the like, for example. In the following exemplary embodiments, it will be assumed that the apparatus is a microprocessor having multiple memory arrays. However, it should be appreciated that these are only exemplary embodiments and the present invention is not limited to such embodiments.

Figure 1:
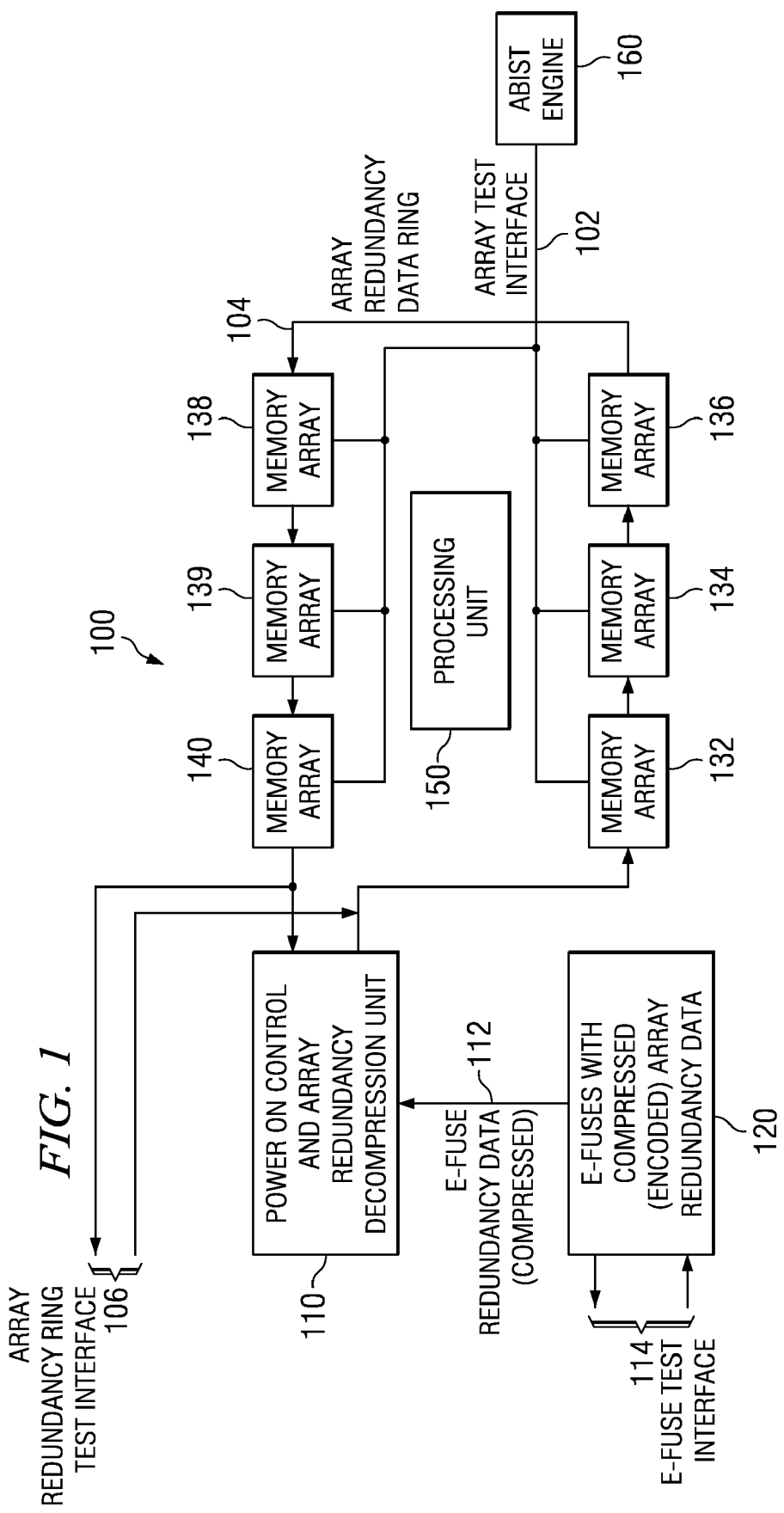
FIG. 1 is an exemplary diagram of a modified array redundancy ring apparatus for a complex multiprocessor with multiple memory arrays.

Referring to FIG. 1, a diagram is provided that illustrates an exemplary block diagram of a modified array redundancy data ring apparatus for a complex microprocessor with multiple memory arrays, in accordance with one exemplary embodiment of the present invention. As shown in FIG. 1, the processing unit 150 and the memory arrays 132, 134, 136, 138, 139 and 140 make up the microprocessor. At test time, the memory arrays 132, 134, 136, 138, 139 and 140 are tested to determine if any of the cells are non-functional. For example, failed cells may be determined by running an array built-in self test (ABIST) engine 160. An external manufacturing tester computing device will initialize and start the ABIST engine 160 which will run tests on the memory arrays 132-140, such as via the array test interface 102, and store results inside the ABIST engine 160. Once testing is complete, the manufacturing tester computing device will scan the failure information out of the microprocessor, such as through the array test interface 102. Analysis of the failure information is done off-chip by the external manufacturing computing device. The end result is a determination of which memory cells need to be mapped to the spare or redundant cells. This data is referred to as the array redundancy data or repair action data, and is used to generate repair actions.

The un-encoded array redundancy data or repair action data is then scanned directly to the array redundancy data ring 104 via the array redundancy ring test interface 106. Once this data is scanned to the array redundancy data ring 104, the ABIST engine 160 re-runs the test to make sure the generated repair actions correct the failing memory cells in memory arrays 132-140. Once it is determined that the repair actions correct the failing memory cells, the image of the array redundancy data ring 104, i.e. the repair action data or array redundancy data, is encoded using the compression methodology described hereafter with regard to FIG. 2.

Upon completion of the encoding of the array redundancy data, the encoded array redundancy data is programmed into the eFuses 120 by the external manufacturing tester computing device via the eFuse Test Interface 114. The eFuse test interface 114 may be used to store the compressed array redundancy data in the eFuses 120, and may further be used to test the eFuses 120 for non-functional eFuses that may contain defective data that needs to be skipped over.

When the microprocessor 100 is powered-on in functional mode, the encoded array redundancy data, i.e. repair action data, read in by the power-on control and array redundancy decompression unit 110 which decodes the encoded data using the methodology outlined in FIG. 2 hereafter. Decompressed array redundancy data may then be reloaded into the array redundancy data ring 104 to determine which memory cells need to be mapped to the redundant cells. After the decompression process, the array redundancy data ring 104 contains the fully decoded array redundancy data and thus, may map failed memory cells to redundant memory cells in the memory arrays 132-140.

In FIG. 1 there are actually two array redundancy rings illustrated. A first array redundancy ring is comprised of the memory arrays 132-140 and is collectively referred to as array redundancy data ring 104. The second array redundancy ring is the combination of array redundancy data collected, compressed, and stored in the eFuses 120 that represents the test results of the array redundancy data ring 104. The present invention uses a compression methodology to both store the array redundancy data into the second array redundancy ring of the eFuses 120 and to read out this data from the eFuses 120 to configure the memory arrays 132-140 of the first array redundancy data ring 104.

The compression methodology used by the present invention is described in commonly assigned and co-pending U.S. patent application Ser. No. 10/981,158, entitled "Algorithm to Encode and Compress Array Redundancy Data," filed on Nov. 4, 2004, which is hereby incorporated by reference. As described in this co-pending U.S. patent application, there are four major types of commands that are used to perform the compression and encoding of the array redundancy data into the eFuses: control, shift zeros, shift actual data, and skip data. There are three different control commands. These types of commands are depicted in the exemplary table 200 provided in FIG. 2.

It should be noted that the control commands illustrated in FIG. 2 are used by an external computer to encode array redundancy data, i.e. repair action data, as mentioned previously above. In addition, the control commands are also used by an eFuse decoder (not shown), which may be part of the power-on control and array redundancy decompression unit 110 or a separate unit for example, to decode the encoded array redundancy data. For purposes of explanation of the various control commands, the way in which these control commands are interpreted during decoding will be described. To perform encoding of array redundancy data, the array redundancy data is analyzed to determine conditions that meet the various control codes such that the control cods are used to encode these identified portions of array redundancy data.

As shown in the exemplary embodiment of FIG. 2, there are three different control commands. The control command defined by the bit code 0000 signifies the end of the eFuse data. The control command defined by the bits 1110 signifies the resumption of shifting the array redundancy ring data, stored either in the eFuses 120 or in the array redundancy data ring 104, starting with the next 4-bit code. The control command defined by the bit code 1111 signifies the reading of the array redundancy data stored in the eFuses 120, but not shifting the data in the array redundancy data ring 104. These last two commands control the skipping of defective eFuse data. Data that is stored in a faulty or defective eFuses is defective data that may render the device unusable. When the 1111 code is encountered by the eFuse decoder, eFuse data continues to be read, but the data is ignored, i.e. is not shifted into the array redundancy data ring 104. When the 1110 control command is encountered, the eFuse decoder resumes normal operation.

The algorithm set forth in co-pending U.S. patent application Ser. No. 10/981,158 is based upon the assumption that most of the array redundancy data or repair action data is unnecessary, i.e. a reasonable amount of the array redundancy data will be zeros. The nature of the repair action data is such that a "0" followed by several "0's" signifies that there is no repair action. Alternatively, a "1" followed by an address signifies a repair action.

Because there are additional piping latches (for timing) between the islands on the chip, there are also occasionally extra dummy latches between some of the repair actions. That is, when working with gigahertz logic signals, it is not always possible to go from point A to point B without staging the signal. Pipeline latches are inserted in the data path to "bridge" long distances. For example, in FIG. 1, pipeline latches could be required to get the array redundancy data ring 104 data from memory array 136 to memory array 138. These extra dummy latches should be skipped over as well during the encoding/decoding.

A second group of commands involves shifting zeros into the array redundancy ring, either the array redundancy ring in eFuses 120 or array redundancy data ring 104. The bit code 0001 signifies shifting one zero into the array redundancy ring, and bit code 0010 signifies shifting two zeros into the array redundancy ring. These commands are used to adjust the boundaries of the array redundancy data using only a 4-bit command.

The bit code 0011 signifies shifting seven zeros into the array redundancy ring, and bit code 0100 signifies shifting eight zeros into the array redundancy ring. The bit code 0101 signifies shifting nine zeros into the array redundancy ring. This encoding example assumes that the repair actions consist of lengths of 7, 8, and 9 bits. This is the reason that the last three commands involve shifting 7, 8 and 9 zeros into the array redundancy ring. If the array redundancy data, i.e. repair action data, consists of different lengths, different numbers of zeros may be shifted into the array redundancy ring.

A third group of commands involves shifting the actual data into the array redundancy ring. The bit code 0110 signifies shifting the next seven actual bits into the array redundancy ring, and the bit code 0111 signifies shifting the next eight actual bits into the array redundancy ring. The bit code 1000 signifies shifting the next nine actual bits into the array redundancy ring, and the bit code 1001 signifies shifting the next fourteen actual bits into the array redundancy ring. The bit code 1010 signifies shifting the next sixteen actual bits into the array redundancy ring, and the bit code 1011 signifies shifting the next eighteen actual bits into the array redundancy ring.

As previously stated, the array redundancy data, i.e. repair action data, in this exemplary embodiment consists of lengths of 7, 8 and 9 bits. Therefore, these commands involve shifting 7, 8, 9, 14, 16 and 18 bits into the array redundancy ring. Accordingly, a shift of 7 bits will shift one portion of repair action data into the array redundancy ring, and a shift of 14 bits will shift two portions of repair action data into the array redundancy ring.

A fourth group of commands involves skipping bits of data from the eFuses 120 when reading the data and loading the data into the array redundancy data ring 104. The bit code 1100 signifies skipping by the number of bits specified in the next 4-bit field (this is also referred to as a short skip). The bit code 1101 signifies skipping by the number of bits specified in the next 8-bit field (this is also referred to as a long skip). For both of these commands, the array redundancy ring is simply shifted and no new data is inserted. The redundancy data ring is always first initialized as zero. Therefore, skipping can effectively move a larger quantity of zeros into the array redundancy ring.

These four types of commands allow the compressed array redundancy data, i.e. repair action data, to be decompressed and shifted into the array redundancy data ring 104. This compression algorithm is based upon both the sizes of the known array redundancy data, or repair actions, and simplicity so that it is not difficult to decode at power-on time. This algorithm is also flexible in that the number of memory arrays can be modified on the integrated circuit device or microprocessor without affecting the design/implementation of the compression/decompression algorithm.

If the sizes of the repair actions for another device are different, then some of the basic zero and actual compression commands may need to be modified. Accordingly, the present invention is not limited to the exemplary embodiments described above and many modifications may be made without departing from the spirit and scope of the present invention.

The present invention further uses this compression/decompression algorithm to permit the storage of array redundancy data generated by multiple testing stages in a single bank of eFuses rather than multiple banks of eFuses as is required in prior art apparatus. With the present invention, the eFuses in the bank of eFuses are arranged as a scan chain with each eFuse in the scan chain having an associated latch. The value stored in the latch is indicative of whether the associated eFuse has been programmed or not. Based on the value of the latch associated with the eFuse, a determination may be made by control logic associated with the bank of eFuses as to whether the eFuse should be skipped or written to during encoding of array redundancy data into the bank of eFuses. The decompression methodology previously discussed above may be used to read the array redundancy data from the eFuses so as to determine the repair actions to be performed on the arrays of components, e.g., the arrays of memory cells in the array redundancy data ring 104.

Figure 3:
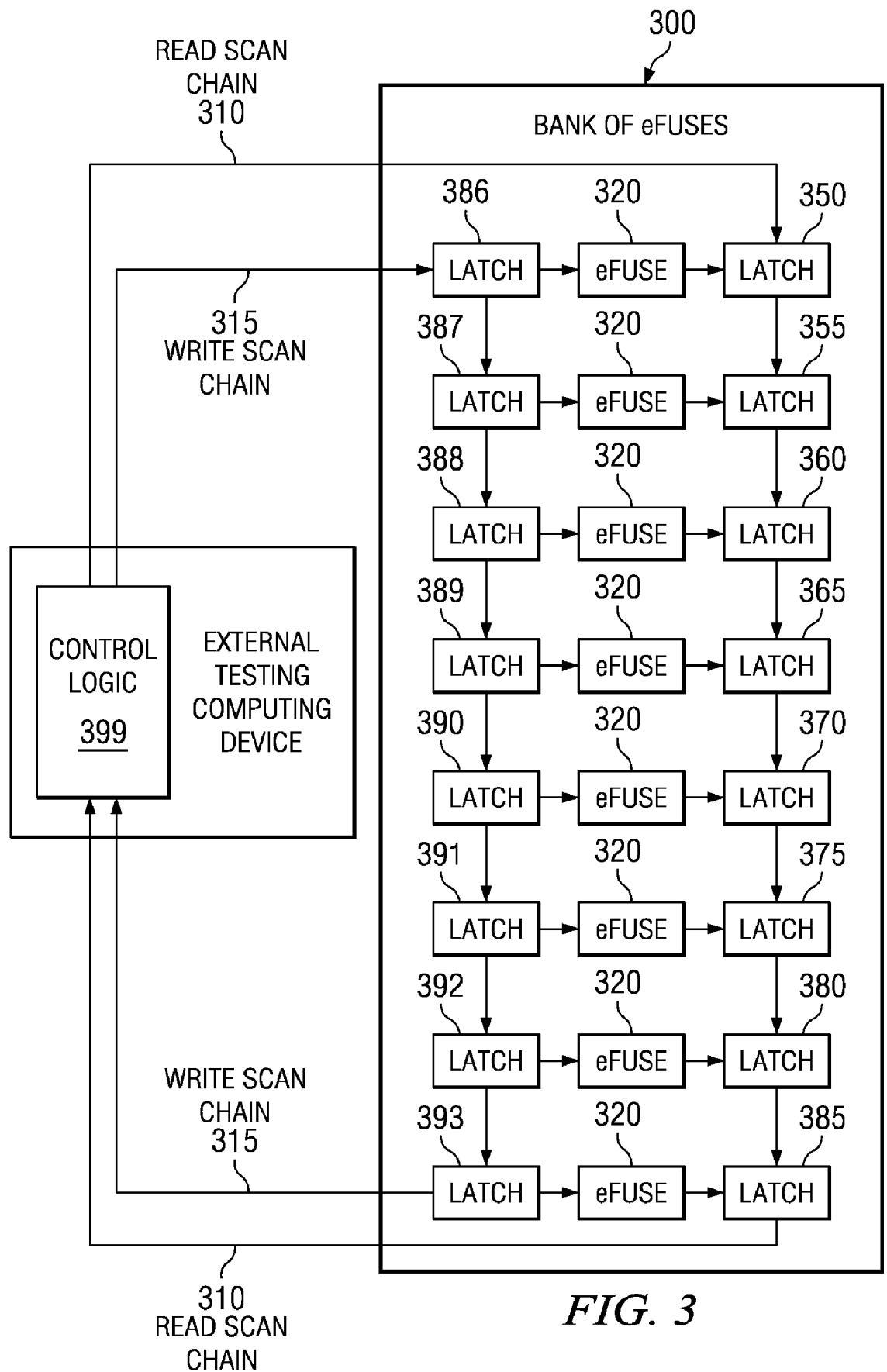
FIG. 3 is an exemplary diagram illustrating a bank of eFuses in accordance with one exemplary embodiment of the present invention.

FIG. 3 is an exemplary diagram illustrating a bank of eFuses in accordance with one exemplary embodiment of the present invention. As shown in FIG. 3, the bank of eFuses 300 includes a scan chain 310 of eFuses 320 which may be programmed based on the results of a stage of testing of an array of components. As discussed above, this stage of testing identifies failed or faulty components that need to be replaced, or substituted for, by redundant components in the arrays. This information is output as the results of this stage of testing as array redundancy data. The array redundancy data is written to a portion of the bank of eFuses 300 for later use in loading the array of components at a power-on of the integrated circuit device. In this way, repair actions may be performed for substituting redundant array components for faulty or failed array components identified during testing.

As mentioned above, during testing, there may be many stages of testing which each generate array redundancy data that needs to be stored on the integrated circuit device for later use during power-on of the integrated circuit device. In known integrated circuit devices, such array redundancy data must be stored in separate banks of eFuses or laser fuses that are dedicated to each stage of testing. With the present invention, however, mechanisms are provided for permitting this array redundancy data from multiple stages of testing to be stored in the same single bank of eFuses.

As shown in FIG. 3, a read scan chain 310 and a write scan chain 315 are provided. The read scan chain 310 is used to determine what has been written to the eFuses 320. The write scan chain 315 is used to update the data stored in the eFuses 320.

Using latches 350-385 permits the control logic 399 of the testing computer to determine which portions of the bank of eFuses 300 should be skipped over when writing additional array redundancy data to the bank of eFuses 300. Thus, for example, during a first stage of testing, the scan chain 315 may be loaded with the redundancy data that is programmed (written) into the eFuses 320. When the eFuses 320 are read, latches 350-360 return the stored encoded value indicating that their corresponding eFuses 320 have been programmed with array redundancy data. In a subsequent stage of testing, additional array redundancy data may need to be written to the bank of eFuses 300. In determining where to begin writing such array redundancy data, the control logic 399 may read the values from the latches 350-385 to determine where the first unprogrammed eFuse 320 in the scan chain 310 is present in the bank of eFuses 300. Alternatively, a marker can be written, with the code "FE" for example, to signify the end of the data for a particular test phase. The control logic 390 may then begin writing the array redundancy data from the subsequent stage of testing at the first unprogrammed eFuse 320. This process may be repeated for each subsequent stage of testing such that array redundancy data from multiple stages of testing is stored in a single bank of eFuses 300.

During writing of the array redundancy data to the bank of eFuses 300, the array redundancy data is compressed and stored in the scan chain 315 of the bank of eFuses 300 using the commands previous described above. Thereafter, various bit codes described above are written to the bank of eFuses 300 as the encoded array redundancy data. Thus, for example, if 9 bits of actual data are being written to the bank of eFuses 300, then bit code 1000 is written to the bank of eFuses 300 in association with this actual data.

Large groups of zeros may be eliminated from having to be written to the bank of eFuses 300 by simply writing the appropriate bit code to the memory to cause zeros to be shifted into the array redundancy data ring at decompression and load time. Thus, for example, rather than writing 9 zeros into the bank of eFuses 300, the bit code 0101 may be written to the bank of eFuses 300 which causes 9 zeros to be shifted into the array redundancy data ring without having to read the zeros from the bank of eFuses 300. This permits strings of actual data to be stored sequentially in the bank of eFuses 300 with strings of zeros being inserted by virtue of the corresponding bit codes. Thus, strings of zeros are eliminated from the data being written to the bank of eFuses 300 and the overall array redundancy data stored in the bank of eFuses 300 is compressed.

The default unprogrammed value for the eFuse is 0. When all of the array redundancy data for a particular stage of testing is written to the bank of eFuses 300, the corresponding "end of e-Fuse data" bit code is written to the bank of eFuses 300 to signify the end of the array redundancy data for that stage of testing. To clearly define the end of the data, a marker of "FE" can be used, for example. This marker simply makes it easier for the control logic 399 to clearly identify the end of data for a particular test phase. The array redundancy data for a next stage of testing may then be written to the bank of eFuses 300 using the next unprogrammed eFuse 320 in a similar manner. In writing the next stage of testing's array redundancy data to the bank of eFuses 300, those eFuses that have been programmed with array redundancy data from the previous stage of testing must be skipped over. As a result, the skip commands illustrated in FIG. 2 may be written used to identify portions of the bank of eFuses 300 to be skipped when reading out the array redundancy data from the bank of eFuses 300 for this stage of testing. Thus, for example, a long skip command, using bit code 1101, may be used to skip a portion of the bank of eFuses 300 so as to decompress and load array redundancy data from a subsequent stage of testing. The decompression and loading of array redundancy data may then commence in a similar manner as described above based on the particular set of bit codes stored for that portion of the bank of eFuses 300.

The skip command does two things. First, it allows the array redundancy data to be concisely encoded via the long or short skip command followed by either 8 or 4 bit that specify how many bits to skip (up to 255 or up to 15 bits). Second, it allows multiple passes when loading the actual array redundancy data ring because each pass can easily skip large groups of data, leaving the previous data in place for those components. Thus, for each stage of testing, the whole array redundancy data for the entire array redundancy data ring may be encoded in the bank of eFuses. The array redundancy data may then be loaded in multiple passes, one pass for each stage of testing used to generate array redundancy data. Subsequent passes will "skip" any previously written data so that only additional failures/defective components are loaded with each pass.

Thus, with the present invention, latches associated with eFuses of a scan chain in a bank of eFuses permit identification of which eFuses have been previously programmed by the current or a previous stage of testing. The skip commands of the encoding/decoding mechanisms of the present invention permit skipping portions of the bank of eFuses 300 so as to access array redundancy data generated by different stages of testing. The combination of these two mechanisms permits array redundancy data generated by multiple stages of testing of an array of components in an integrated circuit device or microprocessor to be stored in a single bank of eFuses 300. As a result, area on-chip is conserved by the mechanisms of the present invention resulting in less cost of the device as well as lower power requirements for operating the device.

As an example operation of the exemplary embodiments of the present invention, assume that there is a two pass test process and in one pass of the test, the un-encoded array redundancy data string is 00000000 RA00000000RARA000000000000000000000000. Zero is the default value of the array redundancy data ring and thus, the skip command may be used to compress/encode this data. Encoding the above array redundancy data would result in 1100 1000 0111 RA 1100 1001 1010 RARA 1101 00011010.

On the second pass of the test, new failures in the memory arrays may be detected. For example, during the second pass, the following un-encoded array redundancy data string may be 00000000RARA000000000RA000000000000000 with the new failure data shown in bold. Encoding this array redundancy data results in 1100 1000 0111 RA 1100 1001 1010 RARA 0101 RA 1100 1111. It should be noted that the shift 9 zero code could also have been a skip 9 code since the default of the array redundancy data ring is zero.

With the above two passes, the data that is written to the bank of eFuses is as follows: 1100 1000 0111 RA 1100 1001 1010 RARA 1101 00011010 1100 1000 0111 RA 1100 1001 1010 RARA 0101 RA 1100 1111, where bold code represent the encoded array redundancy data of the second pass of the test.

With this encoded array redundancy data, the power-on control and array redundancy decompression unit 110 may traverse the array redundancy ring stored in the bank of eFuses 120 twice to decode and reload the array redundancy data for performing repair actions on the memory arrays 132-140. During a first pass, the non-bolded data above is read, decoded and loaded into the array redundancy data ring 104. During the second pass, the bolded data above is read, decoded and loaded into the array redundancy data ring 104. If a third test had been performed, that encoded array redundancy data may be concatenated onto the above encoded data to cause the redundancy data ring to be traversed a third time.

For each encode of the array redundancy data ring, the entire array redundancy ring is encoded so as to maintain alignment of the data for decoding purposes. The above example is the simple pass where subsequent test passes are concatenated to the results of the previous encoded data from a previous stage of testing. The encoding scheme of the present invention also permits providing the capability to do more complex updates. It is possible to only add the new failure data or new repair actions and/or replace previous failure data or repair actions. The skip, shift zero, and shift real data commands may allow one to create such an encoding algorithm. The encoding scheme is flexible and allows numerous ways of creating multi-pass repairs.

Figure 4:
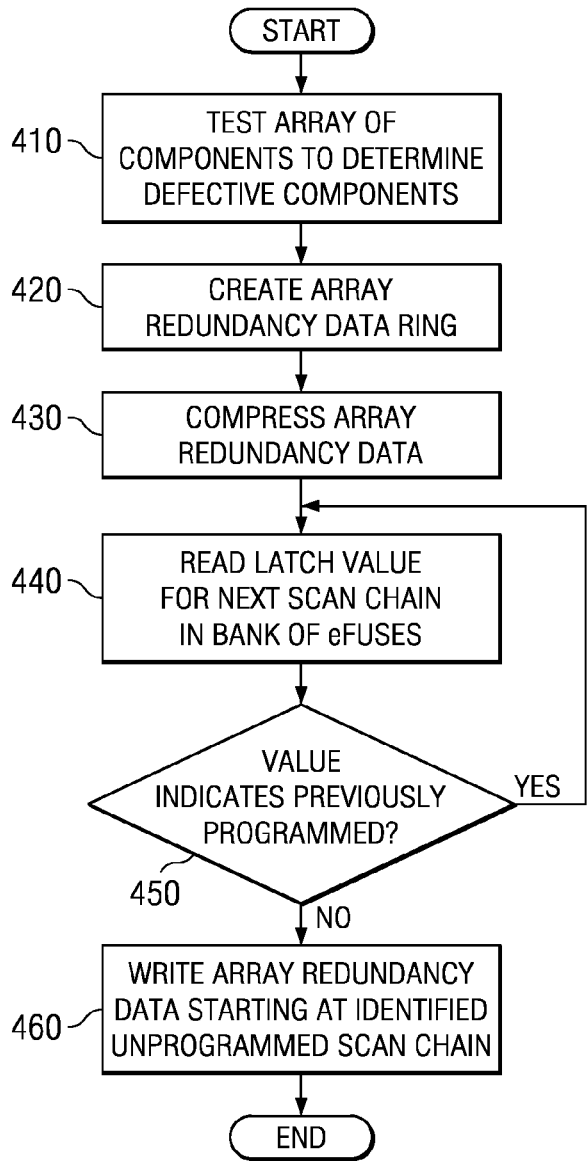
FIG. 4 is a flowchart outlining an exemplary operation for storing array redundancy data in a single bank of eFuses in accordance with one exemplary embodiment of the present invention.
Figure 5:
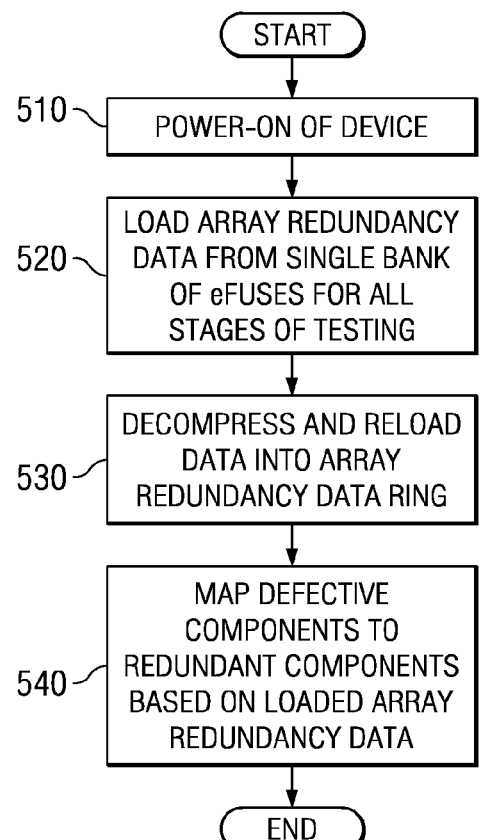
FIG. 5 is a flowchart outlining an exemplary operation for reading array redundancy data from a single bank of eFuses and loading the array redundancy data into an array redundancy data ring in accordance with one exemplary embodiment of the present invention.

FIGS. 4 and 5 are flowcharts that illustrate operations for writing and reading array redundancy data to/from a single bank of eFuses according to one exemplary embodiment of the present invention. It will be understood that each block of the flowchart illustrations, and combinations of blocks in the flowchart illustrations, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustrations support combinations of means for performing the specified functions, combinations of steps for performing the specified functions and program instruction means for performing the specified functions. It will also be understood that each block of the flowchart illustrations, and combinations of blocks in the flowchart illustrations, can be implemented by special purpose hardware-based computer systems which perform the specified functions or steps, or by combinations of special purpose hardware and computer instructions.

FIG. 4 is a flowchart outlining an exemplary operation for storing array redundancy data in a single bank of eFuses in accordance with one exemplary embodiment of the present invention. The operation outlined in FIG. 4 may be performed, for example, by control logic associated with a test computer for storing encoded array redundancy data in a bank of eFuses as discussed previously above.

As shown in FIG. 4, the operation starts by testing the array of components to determine which components are defective (step 410). This step may be accomplished, for example, through the array test interface 102 in a manner generally known in the art. An array redundancy data ring is then created (step 420). The array redundancy data ring contains the data that determines which defective components are mapped to redundant components on the integrated circuit device, for example.

Thereafter, the array redundancy data is compressed/encoded (step 430). This compression/encoding may be performed using the commands described above with regard to FIG. 2, for example. After compression/encoding, the array redundancy data is written to the bank of eFuses in the manner outlined in steps 440-480 discussed hereafter.

The value stored in the latch associated with a next eFuse of the bank of eFuses is read (step 440). A determination is made as to whether the value indicates that the eFuse has been previously programmed (step 450). If so, the operation returns to step 440 and reads the value of the latch for the next eFuse. This process continues until an eFuse is identified that has not been programmed by the current or a previous stage of testing.

If the value stored in the latch associated with the next eFuse indicates that the eFuse has not been previously programmed, the array redundancy data is then written sequentially into the bank of eFuses beginning with the identified first unprogrammed eFuse location (step 460).

The operation then terminates when all of the array redundancy data for this stage of testing is written to the bank of eFuses. This process may be repeated for each subsequent stage of testing with steps 440 and 450 ensuring that array redundancy data from subsequent stages of testing are written to different portions of the same bank of eFuses.

As is generally known in the art, the writing of data to eFuses involves the blowing of eFuses to represent a "1" and the leaving of eFuses in their default state to represent a "0" value. However, the opposite approach may be taken in the case of, for example, inverse eFuses in which blowing of the eFuse actually enables an electrical contact thereby representing a "0" with the default state representing a "1". While the present invention is described in terms of the use of a single bank of eFuses, the mechanisms of the present invention may further be applied to other storage devices including laser fuses, standard memory devices, and the like, which may be provided on the integrated circuit device or microprocessor device itself.

FIG. 5 is a flowchart outlining an exemplary operation for reading array redundancy data from a single bank of eFuses and loading the array redundancy data into an array redundancy data ring in accordance with one exemplary embodiment of the present invention. The operation outlined in FIG. 5 may be performed each time that the integrated circuit device or microprocessor device is powered-on. The operation outlined in FIG. 5 may be performed, for example, by power-on control and array redundancy data decompression logic 110 in FIG. 1, for example.

As shown in FIG. 5, the operation starts with power-on of the integrated circuit device or microprocessor device (step 510). The array redundancy data from the entire bank of eFuses is loaded into the power-on control and array redundancy decompression logic apparatus (step 520). The power-on control and array redundancy decompression logic apparatus then decompresses (decodes) the data and reloads the data into the array redundancy data ring (step 530).

This decompression (decode) process may involve executing operations based on the bit codes stored in the bank of eFuses for the array redundancy data in the bank of eFuses. Thus, the various commands discussed above with regard to FIG. 2 may be performed so as to appropriately access the array redundancy data from the various stages of testing and load this data into the array redundancy data ring. For example, the decompression (decode) process may be performed in multiple passes based on the number of stages of testing that were performed to generate the array redundancy data stored in the bank of eFuses. Thus, if array redundancy data is stored in the bank of eFuses for three stages of testing, then three passes of loading array redundancy data into the array redundancy data ring may be performed. Each pass may involve the use of the skip command to skip over array redundancy data generated by a previous stage of testing. As a result, only additional failures/defective component data is added with each additional pass.

The array redundancy data ring is then used to map the defective components to the redundant components on the integrated circuit device or microprocessor device (step 540). The operation then terminates.

Thus, the present invention provides a mechanism for allowing a single bank of eFuses, laser fuses, or other storage device, to store array redundancy data from a plurality of stages of testing of an integrated circuit device or microprocessor device. Since only a single bank of eFuses is required by operation of the present invention, area and wasted space on-chip for storage of array redundancy data is minimized. Moreover, the cost and power consumption of the device is minimized by reducing the required area for such storage devices on-chip.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be appreciated that the encoding/decoding mechanisms of the present invention can take the form of an entirely hardware embodiment, an entirely software embodiment or an embodiment containing both hardware and software elements. Furthermore, the encoding/decoding mechanisms of the present invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

The encoding mechanism, in a preferred embodiment, may include a data processing system suitable for storing and/or executing program code that includes at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An apparatus, on an integrated circuit device, for storing array redundancy data on the integrated circuit device, comprising:
    a single bank of storage devices dedicated to storing array redundancy data for a plurality of stages of testing of the integrated circuit device; and
    control logic for controlling decoding of encoded array redundancy data stored in the single bank of storage devices, wherein the encoded array redundancy data stored in the single bank of storage devices is array redundancy data generated by a plurality of stages of testing of one or more arrays of devices provided on the integrated circuit device and wherein the encoded array redundancy data includes bit codes that identify a compression methodology of the encoded array redundancy data.

2. The apparatus of claim 1, wherein the single bank of storage devices is a bank of electric fuses (eFuses).

3. The apparatus of claim 1, wherein the single bank of storage devices is arranged as a scan chain of storage devices, and wherein each storage device has an associated latch that stores a value indicative of whether the storage device has been previously programmed or is unprogrammed.

4. The apparatus of claim 1, wherein the bit codes include a skip bit code for skipping a portion of the bank of storage devices to thereby access the encoded array redundancy data for a stage of testing other than a first stage of testing.

5. The apparatus of claim 1, wherein each array of devices in the one or more arrays of devices includes at least one redundant device for substituting for another device in the array, and wherein the array redundancy data identifies failed devices in the one or more arrays of devices for which substitution with a redundant device is needed.

6. The apparatus of claim 5, wherein the control logic decodes the encoded array redundancy data and loads the decoded array redundancy data into the one or more arrays of devices in order to perform one or more repair actions on the one or more arrays of devices.

7. The apparatus of claim 5, further comprising:
    a testing device; and
    a test interface coupled to the one or more arrays of devices and the testing device, wherein the testing device performs, via the test interface, a plurality of stages of testing on the one or more arrays of devices to thereby generate a plurality of sets of array redundancy data and outputs, via the test interface, the plurality of sets of array redundancy data to an external computing device for analysis.

8. The apparatus of claim 7, further comprising:
a storage device interface coupled to the bank of storage devices and the external computing device, wherein control logic in the external computing device encodes the array redundancy data and writes the encoded array redundancy data to the bank of storage devices via the storage device interface.

9. The apparatus of claim 8, wherein the control logic in the external computing device reads values stored in latches associated with storage devices in the bank of storage devices to identify a first storage device that is unprogrammed and writes the encoded array redundancy data from a stage of testing to the bank of storage devices starting at the first storage device that is unprogrammed.

10. The apparatus of claim 1, wherein the decoding of the encoded array redundancy data is performed based on the bit codes.

11. An integrated circuit device, comprising:
a bank of electric fuses (eFuses);
a plurality of memory arrays, wherein each memory array includes a plurality of memory cells, and wherein the plurality of memory cells includes at least one redundant memory cell;
a power on control and array redundancy decompression unit coupled to the bank of eFuses and a at least one memory array in the plurality of memory arrays; and
an array built-in self test (ABIST) unit coupled to the plurality of memory arrays, wherein the ABIST unit performs a plurality of stages of testing on the plurality of memory arrays to generate array redundancy data, the array redundancy data for all of the stages of testing is encoded and stored in the bank of eFuses, and, at power on of the integrated circuit device, the power on control and array redundancy decompression unit decodes the encoded array redundancy data in the bank of eFuses and loads the decoded array redundancy data into the plurality of memory arrays to perform one or more repair actions and wherein the encoded array redundancy data includes bit codes that identify a compression methodology of the encoded array redundancy data.

12. The integrated circuit device of claim 11, further comprising:
an array test interface coupled to the at least one memory array in the plurality of memory arrays; and
an eFuse test interface coupled to the bank of eFuses, wherein the array test interface outputs array redundancy data from the plurality of memory arrays to an external computing device for analysis, and wherein the eFuse test interface receives encoded array redundancy data from the external computing device for storage in the bank of eFuses.

* * * * *